United States Patent
Strobel

(10) Patent No.: US 10,205,483 B2
(45) Date of Patent: Feb. 12, 2019

(54) LINE SIMULATOR

(71) Applicant: Lantiq Beteiligungs-GmbH & Co. KG, Neubiberg (DE)

(72) Inventor: Rainer Strobel, Munich (DE)

(73) Assignee: Lantiq Beteiligungs-GmbH & Co. KG, Neubiberg (DE)

( * ) Notice: Subject to any disclaimer, the term of this patent is extended or adjusted under 35 U.S.C. 154(b) by 195 days.

(21) Appl. No.: 15/122,697

(22) PCT Filed: Mar. 3, 2015

(86) PCT No.: PCT/EP2015/054430
§ 371 (c)(1),
(2) Date: Aug. 31, 2016

(87) PCT Pub. No.: WO2015/132264
PCT Pub. Date: Sep. 11, 2015

(65) Prior Publication Data
US 2018/0167104 A1    Jun. 14, 2018

Related U.S. Application Data

(60) Provisional application No. 61/947,193, filed on Mar. 3, 2014.

(51) Int. Cl.
*H04B 3/40* (2006.01)
*H04M 3/34* (2006.01)
(Continued)

(52) U.S. Cl.
CPC ............ *H04B 3/40* (2013.01); *H04B 3/487* (2015.01); *H04M 3/34* (2013.01); *G06F 17/5009* (2013.01); *H04B 3/32* (2013.01)

(58) Field of Classification Search
CPC .......... G06F 17/5009; H04B 3/32; H04B 3/40
USPC ........ 324/628, 533; 370/249, 290, 248, 315; 375/222, 227, 350, 257; 379/1.03, 1.04, 379/15.02, 21, 22.03, 23, 27.01, 29.01, 379/29.03, 399.01, 406.12, 412, 22,
(Continued)

(56) References Cited

U.S. PATENT DOCUMENTS

| | | | | |
|---|---|---|---|---|
| 4,061,883 A | * | 12/1977 | Chambers, Jr. | H04B 3/36 379/343 |
| 4,835,494 A | * | 5/1989 | Preschutti | H04B 3/10 333/16 |

(Continued)

FOREIGN PATENT DOCUMENTS

TW     200718091     5/2007

OTHER PUBLICATIONS

"Series G: Transmission Systems and Media, Digital Systems and Networks, Digital sections and digital line system—Access networks. Test procedures for digital subscriber line (DSL) transceivers." ITU-T Recommendation G.996.1. Telecommunication Standardization Section of ITU. International Telecommunication Union. (Feb. 2001).

(Continued)

*Primary Examiner* — Gerald Gauthier
(74) *Attorney, Agent, or Firm* — Eschweiler & Potashnik, LLC

(57) ABSTRACT

Simulation devices for simulating communication lines are provided. In some embodiments, different parameters are used along a line length.

21 Claims, 7 Drawing Sheets

(51) Int. Cl.
*H04B 3/487* (2015.01)
*G06F 17/50* (2006.01)
*H04B 3/32* (2006.01)

(58) Field of Classification Search
USPC ............... 379/26.01, 343; 381/17; 455/63.1, 455/67.13, 67.14; 709/208; 333/16; 702/120; 713/503
See application file for complete search history.

(56) References Cited

U.S. PATENT DOCUMENTS

| | | | | |
|---|---|---|---|---|
| 5,514,965 | A * | 5/1996 | Westwood | G01R 31/11 324/533 |
| 5,771,262 | A * | 6/1998 | Benayoun | H03H 11/28 333/17.3 |
| 6,408,071 | B1 * | 6/2002 | Kitayama | H04M 11/06 379/399.01 |
| 6,442,239 | B1 * | 8/2002 | Abdo | H04M 3/308 379/22 |
| 6,690,720 | B1 | 2/2004 | Downey | |
| 7,437,591 | B1 * | 10/2008 | Wong | G01R 31/31919 713/500 |
| 9,672,136 | B2 | 6/2017 | Vanderhaegen et al. | |
| 2003/0005069 | A1 * | 1/2003 | DePaul | H04M 3/304 709/208 |
| 2005/0141673 | A1 * | 6/2005 | Lunt | H04M 3/30 379/22 |
| 2006/0072708 | A1 * | 4/2006 | Warner | H04Q 11/045 379/1.03 |
| 2006/0176841 | A1 * | 8/2006 | Pepper | H04M 3/245 370/315 |
| 2007/0047631 | A1 * | 3/2007 | Bostoen | H04B 3/487 375/222 |
| 2007/0116295 | A1 * | 5/2007 | Vandewege | H04L 1/24 381/17 |
| 2008/0126002 | A1 * | 5/2008 | Chang | G01R 31/31903 702/120 |
| 2008/0160915 | A1 * | 7/2008 | Sommer | H04B 3/32 455/63.1 |
| 2008/0188185 | A1 * | 8/2008 | Shi | H04L 5/0007 455/67.13 |
| 2009/0141644 | A1 * | 6/2009 | Ploumen | H04B 3/487 370/249 |
| 2009/0168972 | A1 * | 7/2009 | Cioffi | H04M 3/304 379/1.04 |
| 2010/0067423 | A1 | 3/2010 | Tsubamoto | |
| 2010/0135374 | A1 * | 6/2010 | Kozek | H04M 3/304 375/227 |
| 2010/0208785 | A1 * | 8/2010 | Lindqvist | H04B 3/32 375/227 |
| 2010/0246413 | A1 * | 9/2010 | Schley-May | H04B 3/40 370/248 |
| 2012/0219123 | A1 * | 8/2012 | Berg | H04B 3/487 379/27.01 |
| 2013/0170629 | A1 * | 7/2013 | Flowers | H04M 3/306 379/23 |
| 2018/0167104 | A1 * | 6/2018 | Strobel | H04B 3/487 |

OTHER PUBLICATIONS

International Preliminary Report on Patentability, International Application No. PCT/EP2015/054430, dated Sep. 6, 2016.
Strobel, Rainer et al. "Wideband Modeling of Twisted-Pair Cables for MIMO Applications." Globecom 2013—Symposium on Selected Areas in Communications. pp. 2828-2833.
Eriksson, Per-Erik et al. "G.fast: Improved model for shunt admittance in G.fast cable model." Geneva, Switzerland—May 2012, ITU—Telecommunication Standardization Sector 4A-045, Temporary Document 2012-058. 8 pages.
International Search Report and the Written Opinion of the International Searching Authority, International Patent Application No. PCT/EP2015/04430 dated Jun. 29, 2015.
Extended European Search Report dated Jul. 31, 2018 for EP Application No. 18173152.2.

* cited by examiner

LINE SIMULATOR

REFERENCE TO RELATED APPLICATIONS

This application claims the benefit of International Patent Application No. PCT/EP2015/054430 filed on Mar. 3, 2015, which claims priority to U.S. Provisional Application No. 61/947,193 filed Mar. 3, 2014, entitled "LINE SIMULATOR", the contents of which are herein incorporated by reference in their entirety.

TECHNICAL FIELD

The present application relates to line simulators and to corresponding methods.

BACKGROUND

Line simulators are widely used in communication laboratories and communication device development to test functionality and performance of communication systems and devices. For example, to test a communication device the communication device is coupled to a line simulator, which simulates the behavior of a communication line (for example wireline) to which the communication device is intended to be coupled during actual deployment later. In other words, the line simulator simulates characteristics of an actual physical communication line. For digital subscriber line (DSL) systems the simulated line may be a subscriber loop, for example a twisted wire pair. Digital subscriber line or DSL as used herein generically refers to any of a plurality of DSL flavours, like ADSL, ADSL2, VDSL, VDSL2 and is intended to include also the upcoming G.fast.

Most conventional line simulators are single line devices, which simulate only a single communication line. It is difficult to use such line simulators to also investigate effects of crosstalk between a plurality of lines on the line data transmission. To emulate crosstalk at least to some extent, such conventional line simulators may create a specific noise on the line.

For crosstalk cancellation systems like vectoring systems employed in some DSL flavours (for example as defined in ITU-T G.993.5 or as used in G.fast), crosstalk such as far-end crosstalk (FEXT) cannot sufficiently be emulated by simply inserting noise. Therefore, in such cases a multi-line simulator with coupling devices between different lines is required to simulate crosstalk. Such devices, however, only exist for comparatively low frequencies as used for example in VDSL, for example up to about 30 MHz.

However, for example other communication standards like the upcoming G.fast also use higher frequencies, for example up to about 212 MHz. Conventional multi-line simulators may not be able to simulate the characteristics of the communication lines with sufficient accuracy, in particular for high frequencies.

SUMMARY

According to an aspect, a communication line simulation device for simulating a plurality of communication lines is provided, comprising:
for at least one of the communication lines, at least two section simulators that use different parameters.
In other embodiments, other techniques may be used.

The above summary is intended to give only a short overview of some aspects of the present application and is not to be construed as limiting.

DETAILED DESCRIPTION

In the following, various embodiments will be described in detail referring to the attached drawings. It is to be noted that these embodiments serve illustrative purposes only and are not to be construed as limiting. For example, while embodiments may be described as comprising a plurality of features or elements, this is not to be construed as indicating that all those features or elements are necessary for implementation. Instead, in other embodiments some of the features or elements may be omitted, and/or may be replaced by other features or elements. In yet other embodiments, additional features or elements in addition to those explicitly shown or described may be provided. Furthermore, features or elements from different embodiments may be combined to form further embodiments. Variations or modifications described with respect to one of the embodiments may also be applicable to other embodiments unless noted to the contrary.

Embodiments relate to line simulator devices. A line simulator device, in general, is a device which may be used to simulate the behavior of one or more communication lines. Examples for communication lines may be wirelines used to provide data services (for example Internet) to customers, for example using digital subscriber line techniques like ADSL, VDSL, VDSL2 or the upcoming G.fast, but not limited thereto.

Line simulators according to some embodiments may for example be used to test communication equipment, for example by connecting the communication equipment to the line simulator.

It should be noted that for simplicity's sake the term "simulation" and "emulation" are used synonymously herein for any technique which provides a behavior similar or identical to the behavior of a simulated/emulated entity. In particular, the term simulation, simulator and the like is intended to also cover emulation techniques and vice versa. This corresponds to a common use of the terms, as e.g. line simulators are sometimes also referred to as line emulators, e.g. depending on a manufacturer.

Before discussing embodiments of line simulators and associated methods in detail, some effects will be discussed which at least in part are not emulated by some conventional line simulators. Some embodiments of line simulators described herein may at least to some extent simulate one or more of the effects described hereinafter. However, this is not to be construed as indicating that embodiments described herein necessarily simulate such effects.

Figure 1:
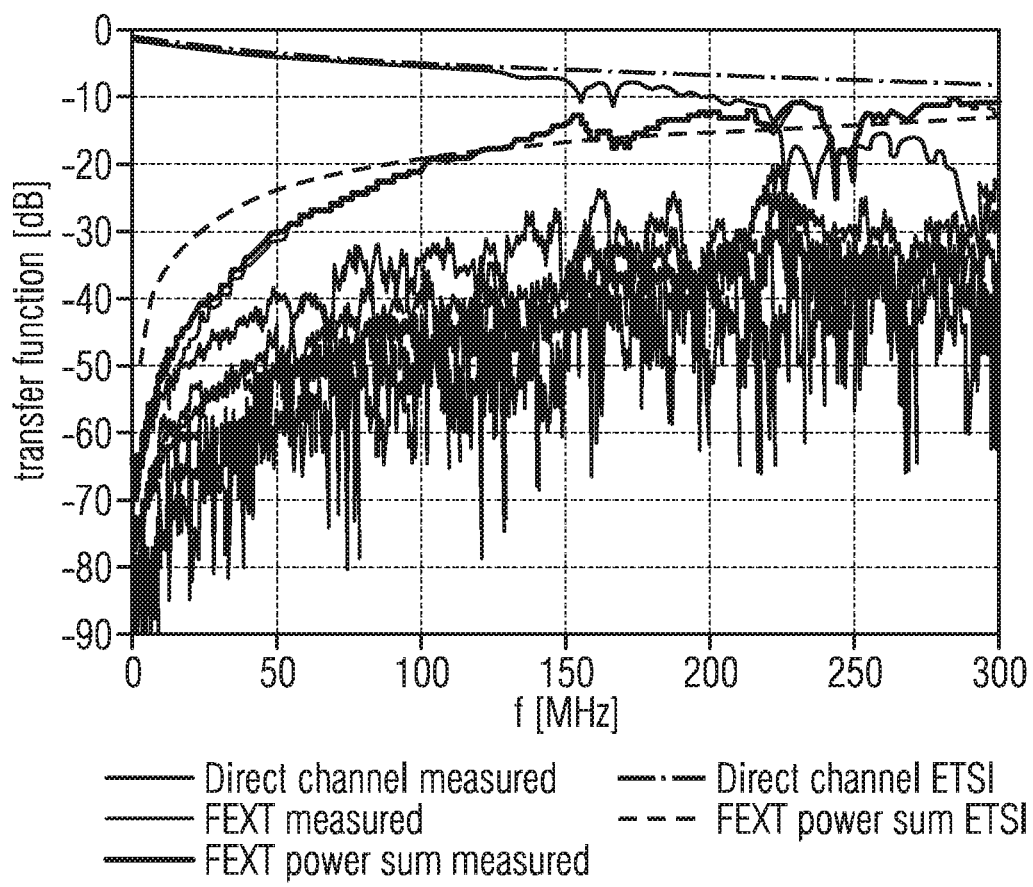
FIG. 1 is a diagram for explaining some effects in quad cables.

FIG. 1 illustrates various measurements and simulations for so-called quad cables. FIG. 1 shows various transfer functions in dB over the frequency. Quad cables are wireline connections where for example two pairs, for example two twisted pairs, are used to transmit data, the two pairs being located close to each other. Conventional simulations based on a channel model discussed e.g. in ETSI TS 101 are marked "ETSI" and are shown for a direct channel and a sum of far-end crosstalk (FEXT). Additionally, a measurement for the direct channel, for measured far-end crosstalk and for a measured power sum of far-end crosstalk are shown. In such quad cables, the in-quad crosstalk may be significantly different compared to intra-quad crosstalk, i.e. crosstalk between different quads. The in-quad crosstalk may even be stronger than the direct channels.

Conventional models may not distinguish between quad cables and pair cables (for example single twisted pairs). In contrast, as will be discussed later in detail, some embodiments described herein may be used to provide an improved simulation of quad cables, for example for testing purposes.

Figure 2:
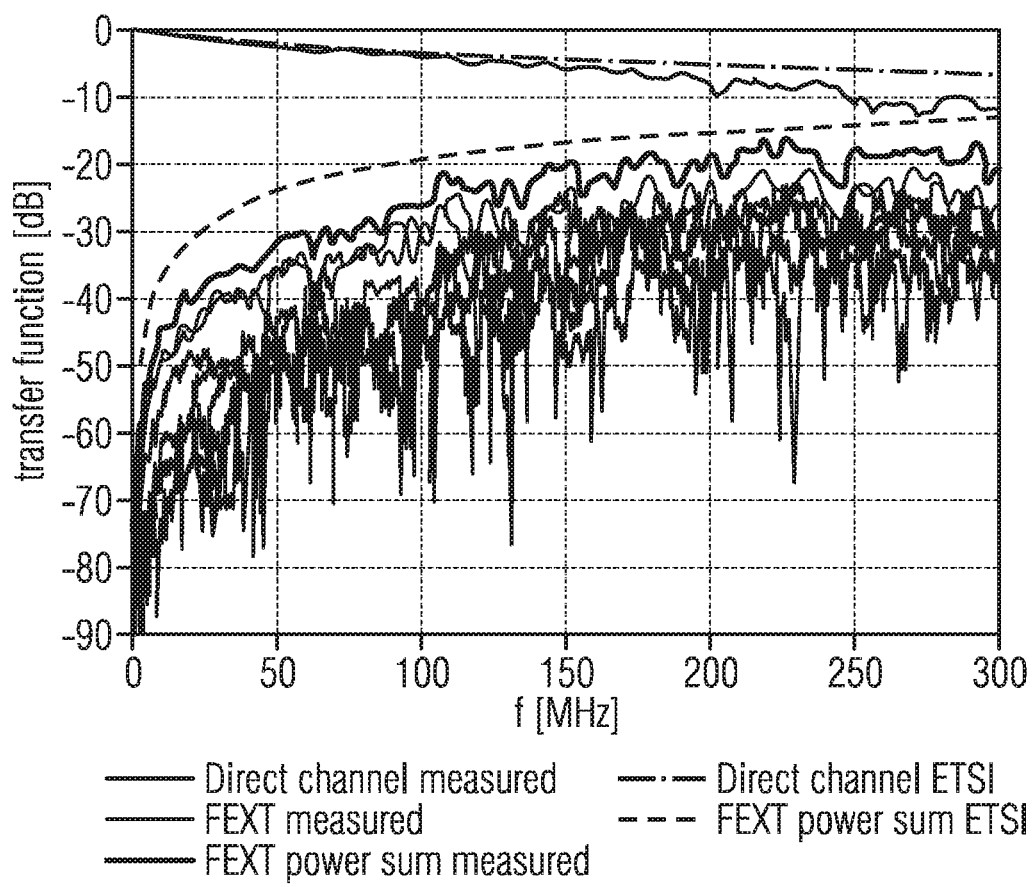
FIG. 2 is a diagram illustrating some effects in lines due to crosstalk.

FIG. 2 illustrates a further effect occurring in transmission lines, also referred to as passivity. The direct channel ETSI line in this case illustrates the direct channel without crosstalk according to a model, while as shown as "direct channel measured" the actual direct channel loses some power in particular for high frequencies. Such a loss of power of a direct channel is not considered in existing line simulation models. In case the attenuation by crosstalk is close to the direct channel attenuation and the direct channel degradation is ignored as in conventional models, the binder may no longer be passive.

Figure 3:
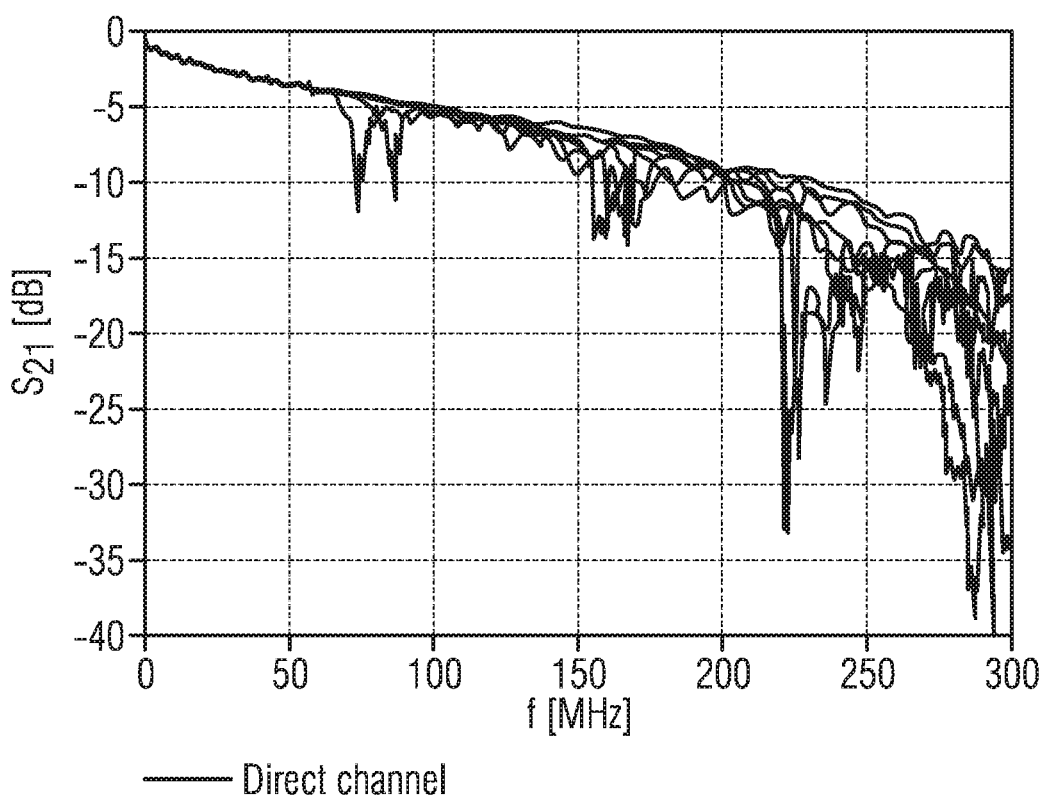
FIG. 3 is a diagram illustrating high-frequency effects in cables.

A further effect that may be taken into account in some embodiments is illustrated in FIG. 3, which illustrates different direct channels within a same cable. As can be seen, at higher frequencies the direct channels may be very different and may contain notches. In conventional models used for simulations, typically all direct channels are the same.

Figure 4:
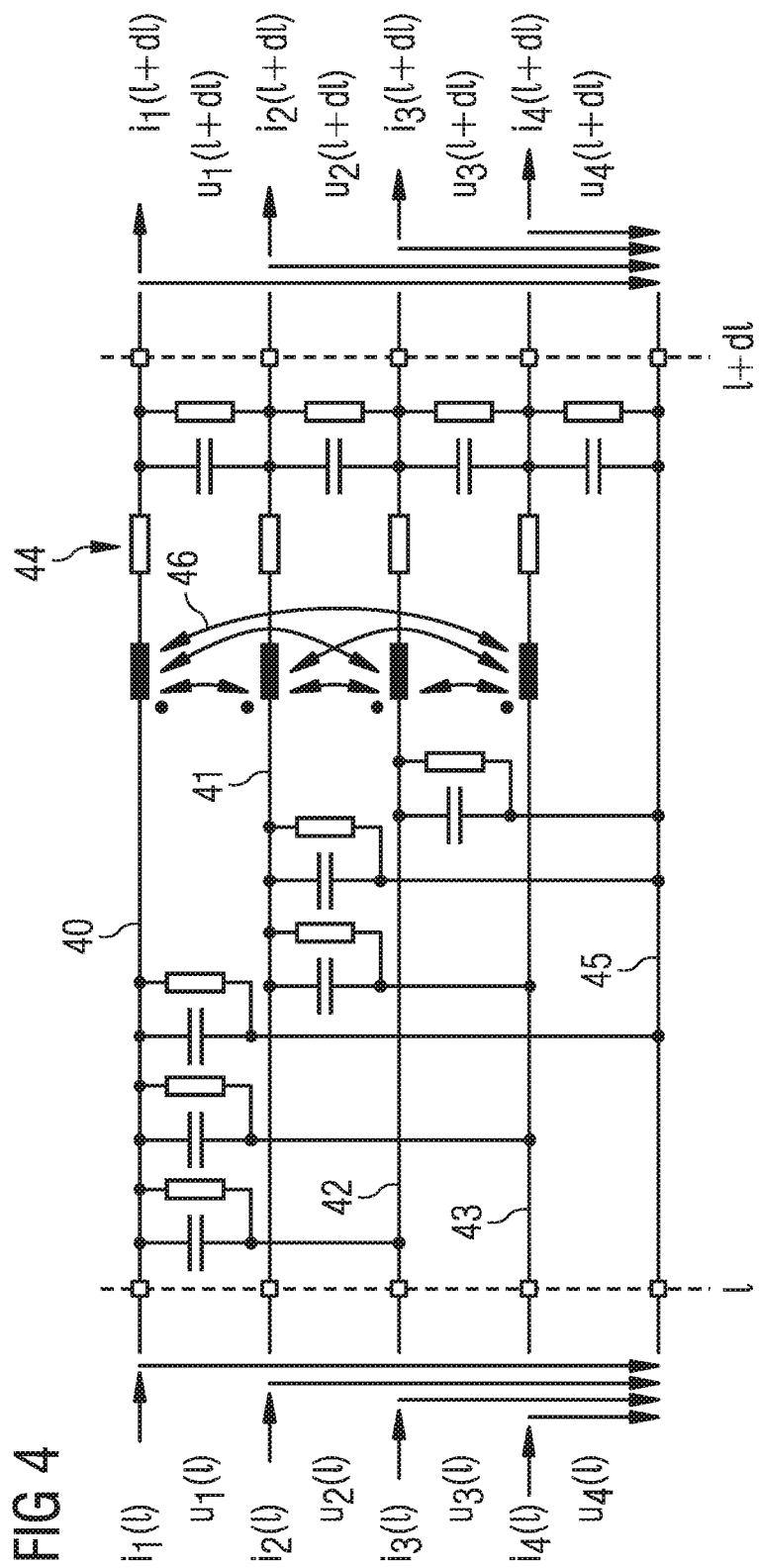
FIG. 4 is a diagram illustrating an equivalent circuit of a multi-pair cable.

In embodiments, simulation devices are provided which may emulate a direct transmission path between near- and far-end as well as crosstalk between multiple lines. Such simulation devices may simulate a multi-pair cable (for example a quad cable) with crosstalk. FIG. 4 illustrates an equivalent circuit for a cable comprising four wires 40, 41, 42 and 43. For example, wires 40, 41 may form a first pair (for example twisted pair), and wires 43, 44 may form a second pair (for example twisted pair). 45 denotes a reference potential, for example ground. The cable is shown between a length l and a length l+dl.

$i_1(l)$ to $i_4(l)$ denote currents in the individual wires 40, 41, 42 and 43 at length l, and $i_1(l+dl)$ to $i_4(l+dl)$ denote corresponding currents at d+dl. $u_1(l)$ to $u_4(l)$ denote voltages at lines 40, 41, 42 and 43 with respect to reference potential 45 at position l, and $u_1(l+dl)$ to $u_4(l+dl)$ denote corresponding voltages at position l+dl.

Line impedances in the equivalent of FIG. 4 are represented by resistors 44, and couplings between the lines are represented by capacitors and resistors as illustrated. Crosstalk is represented by arrows 46, for example due to inductive coupling between lines.

A model based on the equivalent circuit of FIG. 4 may be used to simulate one or more high frequency effects as illustrated in FIGS. 1-3. Parameters for the model (for example resistances, capacitances, inductivities etc.) may be taken from measurements. Random variations of the line parameters (for example resistors, capacitors, inductivities etc. of the equivalent circuit of FIG. 4) according to a statistical model allows to model random variations of direct channel and crosstalk in some embodiments, as may occur in real cables.

Based on the equivalent circuit of FIG. 4, by using conventional transformation steps a complete matrix description of direct channels, near-end crosstalk and far-end crosstalk may be computed which allows to describe a cascade of different network sections (for example consecutive cable lengths dl) correctly. While the equivalent circuit of FIG. 4 illustrates 4 wires (e.g. two twisted pairs), the techniques and embodiments described herein may be applied to any number of wires, e.g. more than two twisted pairs.

Next, various techniques usable for building a simulation device representing e.g. the equivalent circuit of FIG. 4 in a comparatively simple hardware structure will be discussed.

Figure 5:
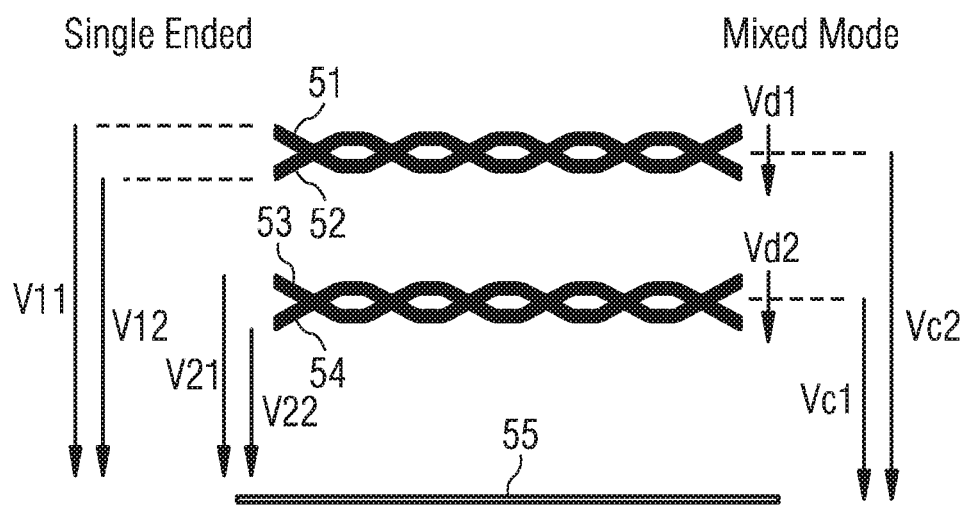
FIG. 5 is a diagram illustrating a single-ended mode and mixed mode in twisted pair cables.

FIG. 5 illustrates an arrangement of two twisted wire pairs, a first pair being formed by wires 51, 52 and a second pair being formed by wires 53, 54. 55 illustrates a reference potential, for example ground. The arrangement of FIG. 5 may be simulated by simulation devices according to embodiments. The arrangement of FIG. 5 may be described using a single-ended description represented on the left side of FIG. 5, which uses voltages V11, V12 for the first pair (wires 51, 52) and voltages V21 and V22 for the second pair (wires 53, 54), one voltage for each wire. The voltages are given with respect to reference potential 55. Sections of lines or twisted pairs shown in FIG. 1 may be simulated using appropriate circuitry, for example based on the equivalent circuits of FIG. 4.

Furthermore, a mixed mode description may also be used to define the voltages in the arrangement of FIG. 5, which is shown on the right side of FIG. 5. In a mixed mode description, a first differential voltage Vd1=V11−V12 for the first twisted pair 51, 52 and a second differential voltage Vd2=V21−V22 for the second twisted pair 53, 54 may be used. Furthermore, a first common mode voltage VC1=(V11+V12)/2 for the first twisted pair 51, 52 and a second common mode voltage Vc2=(V21+V22)/2 for the second twisted pair 53, 54 may be used. The two descriptions (single-ended and mixed mode) contain the same information.

Using the mixed-mode description, crosstalk is not only caused by signals propagating directly from differential mode voltage Vd1 to differential mode voltage Vd2 (i.e. differential mode of a first twisted pair 51, 52 causing crosstalk in the differential mode of the second twisted pair 53, 54), but there is also crosstalk which propagates from the differential mode voltage Vd1 into the common mode voltages Vc1 and Vc2 and back to the differential mode Vd2 and the other way round, which crosstalk has different properties from the crosstalk directly from Vd1 to Vd2 or vice versa. In other words, the differential mode in the first twisted pair 51, 52 causes crosstalk in the common mode voltages Vc1 and Vc2, and this in turn influences Vd2. Conventional simulation devices typically use the differential mode voltages only and therefore do not take into account the full crosstalk. In embodiments, instead of using the mixed mode, the single-ended mode with all four voltages V11, V12, V21 and V22 is used, which for example allows to correctly emulate common mode noise which is then inserted into crosstalk of the lines. In contrast, conventional devices only using differential mode voltages (for example Vd1, Vd2)

cannot take into account a common mode crosstalk effect, which, however, exists in actual lines. In particular, common mode crosstalk may have a significant impact on noise on a line. Therefore, taking common mode crosstalk into account may provide a more realistic simulation. However, it is to be noted that other embodiments do not take common mode crosstalk into account.

In embodiments, connections like lines, for examples wires, are simulated with varying characteristics over the whole line length. For example, referring back to FIG. 4, the equivalent circuit shown may be provided repeatedly for a number of consecutive length portions dl. In contrast, conventional simulators typically use constant line characteristics over a whole line length. For example, in conventional solutions circuit elements representing a transmission line, for example a wire (inductivity L, capacitance to reference potential C, line resistance R and line resistance to reference potential G) are typically constant over a whole line length.

Figure 6:
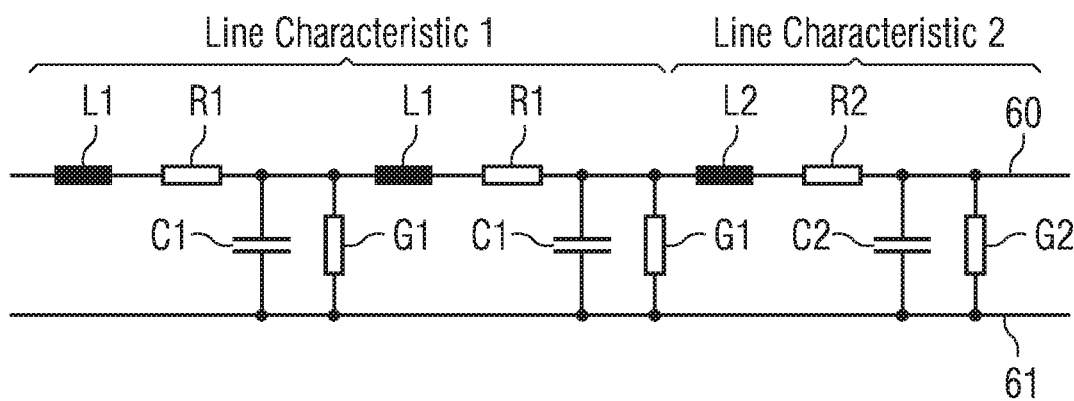
FIG. 6 illustrates loop characteristic changes which are used for simulation in some embodiments.

To illustrate this, FIG. 6 shows an example for a single line 60, for example a single wire, having changing characteristics over a line length. 61 denotes a reference potential. In a first part, labeled "line characteristic 1", transmission line 60 is characterized for example by an inductivity L1, a resistance of the line R1, a capacitance to reference potential 61 C1 and a resistance to reference potential 61 G1. In the example of FIG. 6, these elements are repeated twice. This serves merely as an example, and in embodiments any number of repetitions of such elements, including high numbers of repetitions (e.g. more than 10, more than 50 or more than 100 repetitions), may be used. In a second part, labeled "line characteristic 2", line 60 is characterized by L2, R2, C2 and G2. One or more of L2, R2, C2 and G2 may be different from L1, R1, C1 and G1, respectively. With such embodiments, the varying characteristics may cause reflections in the line. By taking such reflections into account, a line emulation may be more precise than conventional solutions with constant line characteristics. Nevertheless, other embodiments may use constant line characteristics.

While two different line characteristics are shown as an example in FIG. 6, this is not to be construed as limiting, and more than two different line characteristics may be provided, for example three or more different line characteristics in different sections of a line. Such different line characteristics may be provided for each of a plurality of lines.

Figure 7:
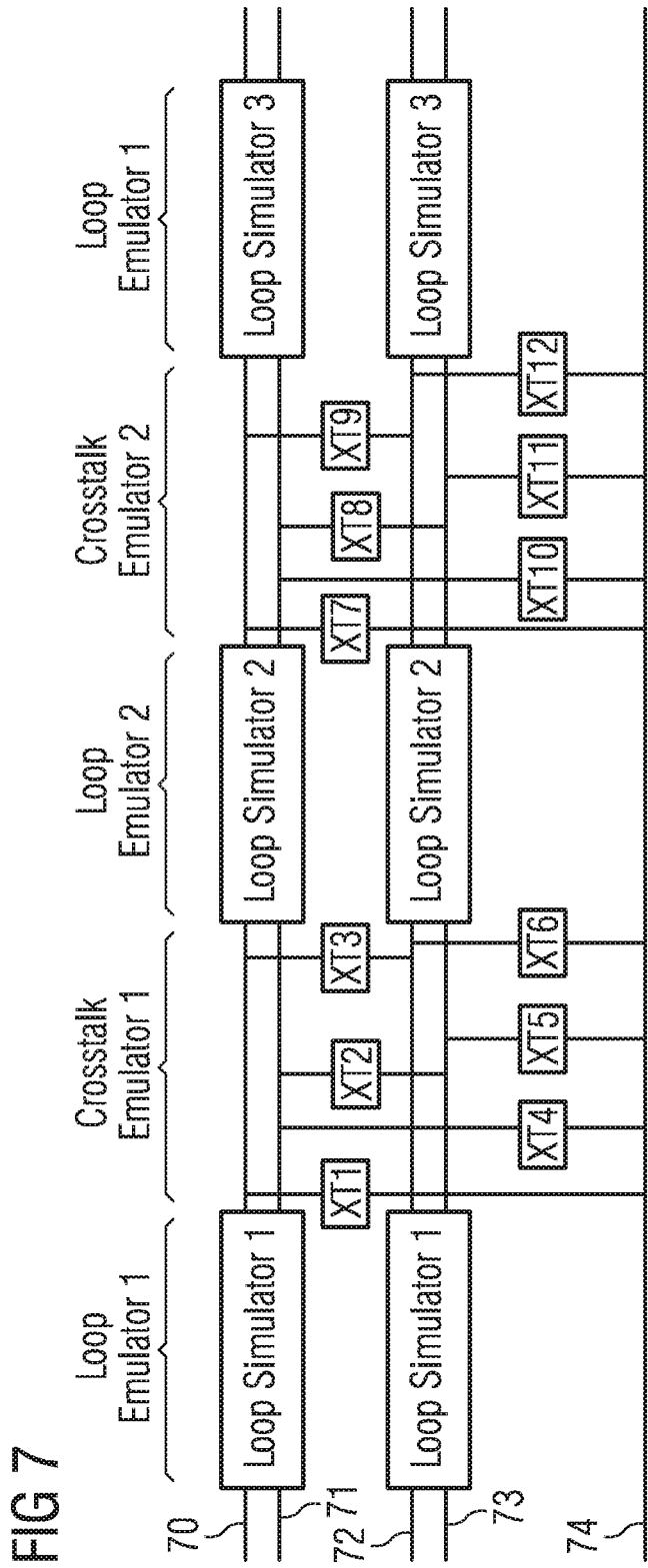
FIG. 7 is a block diagram of a simulator device according to an embodiment.

FIG. 7 illustrates a block diagram of a simulation device according to an embodiment. The simulation device of FIG. 7 simulates four wires 70, 71, 72 and 73. Wires 70, 71 form a first loop, for example a first twisted pair, and wires 72, 73 form a second loop, for example a second twisted pair. Numeral 74 denotes a reference potential. In other embodiments, a different number of wires may be simulated. In some embodiments, two twisted pairs may form a quad cable, for example a so-called star quad. Such quad cables may have specific properties regarding crosstalk. Such properties may be simulated by choosing parameters like L, R, C and G appropriately. A simulation device in some embodiments may simulate one or more of such quad cables, e.g. star quads.

Each loop in the embodiment of FIG. 7 has three loop simulators, labeled "loop simulator 1" to "loop simulator 3". The loop simulators for both loops having the same number (for example loop simulator 1 for wire 70, 71 and loop simulator 1 for wire 72, 73) together are also referred to as loop emulator in FIG. 7. Each loop simulator may simulate the respective wire 70, 71 using circuit elements for example as illustrated in FIG. 6, i.e. inductances L, resistors R, capacitances C to a reference potential and resistors G to a reference potential. In particular, each loop simulator for each wire 70-73 may comprise one or more groups of L, R, C and G as illustrated in FIG. 6, for example a plurality of such groups (two groups showing in line characteristic 1 of FIG. 6). Loop simulators having different number (for example loop simulator 1 and loop simulator 2) may use different values for at least one or more of L, R, C and G, as already explained with respect to FIG. 6. Loop simulators for different wires may use different or the same values.

As explained with reference to FIG. 6, provision of different loop simulators using different parameters allows to take changing properties of the wires into account and/or to generate reflections, which also may occur in real life. In other words, in FIG. 7 a plurality of loop simulators (three in the example of FIG. 7, but not limited thereto) are arranged in a cascade, which allows each section of the cascade to have different properties.

Between the loop simulators, crosstalk emulators are provided (two crosstalk emulators in the example of FIG. 7, but not limited thereto). The crosstalk emulators are represented by elements XT1-XT12 representing couplings between individual lines and also couplings between individual lines and the reference potential. Other arrangements may be used as well. The different elements XT1-XT2 may simply comprise weighting factors for weighting a signal in one line with the weighting factor and adding it to the signal of the respective other line or to the reference potential 74.

For each of the elements XT1-XT12, different or same weighting factors may be used in both directions (for example for XT2 from wire 71 to wire 72 and from wire 72 to wire 71.

In some embodiments, crosstalk between the wire pairs (loops), also referred to as intra-pair crosstalk, is taken into consideration in a different manner than in conventional solutions, for example by providing couplings via the reference potential 74. As already illustrated in FIG. 5, often two pairs of lines, in particular two twisted pairs, are used. In many applications, these two pairs (for example 70, 71 and 72, 73) are additionally twisted around each other to form a so-called cord. Conventional simulation devices typically only measure crosstalk between the pairs of wires. However, there also exists crosstalk between individual lines and even individual lines and other lines. Such intra-wire crosstalk may be taken into account in some embodiments, for example as illustrated in FIG. 7.

It should be noted that by providing two crosstalk emulators in FIG. 7 (or any other number), changing crosstalk parameters may be taken into account. For example, coupling coefficients used in XT1-XT6 may differ from coupling coefficients used in XT7-XT12. In the embodiment of FIG. 7, coupling elements do not act on the differential mode voltages (see FIG. 5), but act between individual wires and from the individual wires to a common reference potential (for example 74 in FIG. 7). Additional couplings to the ones shown may be present, for example between wires 70 and 73 or between wires 71 and 72 in other embodiments. Therefore, the embodiment of FIG. 7 serves only for illustrative purposes and is not to be construed as limiting.

Figure 8:
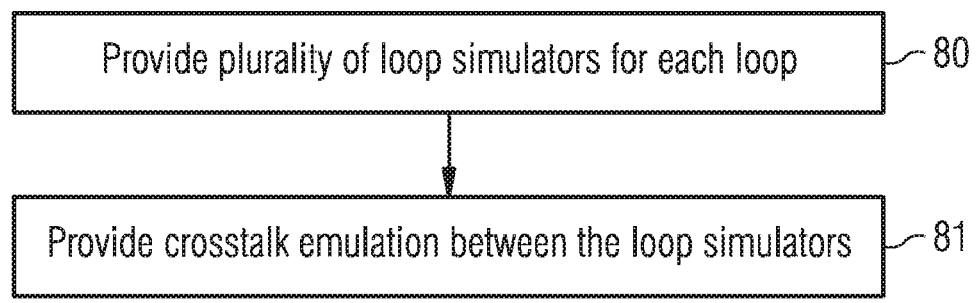
FIG. 8 is a flowchart illustrating a method according to an embodiment.

FIG. 8 illustrates a method according to an embodiment. The method of FIG. 8 may be used to produce a simulation device as discussed above, but is not limited to the exact embodiments of simulation devices illustrated.

At 80, a plurality of loop simulators for each loop is provided, for example two loop simulators or three loop simulators as illustrated in FIG. 7, but not limited thereto. Optionally, at 81 crosstalk emulation between the loop simulators is provided. The crosstalk emulation may be based on single-ended voltages and may include crosstalk couplings between emulated wires or lines and a reference potential.

In other embodiments, other techniques may be used.

In some embodiments, a DSL loop emulation device for emulating a higher frequency line or loop above 30 MHz is provided, the device comprising:

at least two circuit sections that emulate different lines or loops in a cable bundle, and a reference line connected to each circuit section to create a common mode noise.

Such a device may further comprise cascades of circuit sections with different circuitry to emulate different line characteristics.

Such a device also may comprise, in some embodiments, a circuit section that emulates a wire of a twisted pair.

A method may be provided that produces an emulation device as described above.

Devices as discussed herein may in particular be suitable to simulate behavior of communication lines for wire frequencies, for example above 30 MHz.

The above-described embodiments serve only as illustrative examples and are not to be construed as limiting.

The invention claimed is:

1. A communication line model device comprising:
   a first circuit that simulates a first section representing a first length of one communication line of a plurality of communication lines in a wireline network using a first parameter,
   a second circuit that simulates a second section representing a second, different length of the one communication line using a second parameter that is different from the first parameter; and
   wherein the communication line model device is configured to generate a crosstalk model of crosstalk on the at least one communication line using the first and second circuits.

2. The device of claim 1, wherein the first and second parameters comprise one or more of a line inductance, a line resistance, a capacitance to a reference potential or a resistance to a reference potential.

3. The device of claim 1, further comprising a reference potential simulating a common mode noise.

4. The device of claim 1, further comprising a third circuit to simulate the crosstalk.

5. The device of claim 4, wherein the third circuit comprises crosstalk couplings to a reference potential.

6. The device of claim 4, wherein the third circuit operates based on single-ended voltages with respect to a reference potential.

7. The device of claim 4, further comprising a plurality of crosstalk simulation devices, at least two of the plurality of crosstalk simulation devices using different crosstalk parameters.

8. The device of claim 7, wherein the crosstalk simulation devices are arranged between the first and second sections.

9. The device of claim 1, further comprising respective first and second circuits for other communication lines of the plurality of communication lines in the wireline network that simulate first and second sections of a respective communication line.

10. The device of claim 1, wherein the first and second sections simulate a loop formed by the plurality of communication lines.

11. The device of claim 1, wherein the plurality of lines comprises four wires, arranged in a first pair and a second pair, each of the first pair and second pair forming a loop.

12. The device of claim 1, wherein the device is configured to simulate a DSL loop.

13. The device of claim 1, wherein the first and second circuits simulate crosstalk plurality of the communication lines for communication frequencies above 30 MHz.

14. A communication line model method comprising the steps of
   simulating a first section representing a first length of one communication line of a plurality of communication lines in a wireline network using a first parameter;
   simulating a second section representing a second, different length of the one communication line using a second parameter that is different from the first parameter; and
   generating a crosstalk model of crosstalk on the at least one communication line using the first and second sections.

15. The method of claim 14, wherein the first and second parameters comprise one or more of a line inductance, a line resistance, a capacitance to a reference potential or a resistance to a reference potential.

16. The method of claim 14, further comprising simulating respective communication lines of the plurality of communication lines in the wireline network that simulate first and second sections of a respective communication line.

17. The method of claim 14, wherein the steps of simulating first and second sections simulate crosstalk plurality of the communication lines for communication frequencies above 30 MHz.

18. The method of claim 17, wherein the step of simulating first and second sections simulate crosstalk plurality of the communication lines for communication frequencies up to about 212 MHz.

19. A communication line model device, comprising:
   a first twisted pair comprising first and second lines;
   a second twisted pair comprising third and fourth lines;
   wherein the first and second twisted pairs are packaged in a quad bundle;
   first and second loop simulators that simulate first and second different lengths, respectively, of the first twisted pair, using first and second parameters, respectively, that differ from one another and reflect variation along the length of the first twisted pair;
   third and fourth loop simulators that simulate third and fourth different lengths, respectively, of the second twisted pair using third and fourth parameters, respectively, that differ from one another and reflect variation along the length of the second twisted pair; and
   a first plurality of crosstalk simulation devices located between the first and second loop simulators, wherein the first plurality of crosstalk simulation devices comprise weighting factors that reflect crosstalk between the first and second twisted pairs associated with one or both of a differential mode voltage and a common mode voltage of the first and second twisted pairs.

20. The communication line model device of claim 19, wherein the first plurality of crosstalk simulation devices comprise weighting factors that further represent crosstalk between individual lines of one or both of the first and second twisted pairs and a reference potential.

21. The communication line model device of claim 19, further comprising a second plurality of crosstalk simulation devices located downstream of the second loop simulator in a downlink direction, wherein the second plurality of crosstalk simulation devices comprise weighting factors different from the weighting factors of the first plurality of crosstalk simulation devices that reflect crosstalk between the first and second twisted pairs at a location different from that of the first plurality of crosstalk simulation devices, wherein the weighting factors of the second plurality of crosstalk simulation devices are associated with one or both of a differential mode voltage and a common mode voltage of the first and second twisted pairs.

* * * * *